United States Patent [19]

Sullivan

[11] Patent Number: 5,028,820
[45] Date of Patent: Jul. 2, 1991

[54] SERIES TERMINATED ECL BUFFER CIRCUIT AND METHOD WITH AN OPTIMIZED TEMPERATURE COMPENSATED OUTPUT VOLTAGE SWING

[75] Inventor: Steven C. Sullivan, Campbell, Calif.
[73] Assignee: Digital Equipment Corporation, Maynard, Mass.
[21] Appl. No.: 370,916
[22] Filed: Jun. 23, 1989
[51] Int. Cl.$^5$ .......................................... H03K 19/086
[52] U.S. Cl. ................................... 307/455; 307/310; 307/264; 307/491; 307/443
[58] Field of Search ............... 307/455, 443, 310, 362, 307/264, 491

[56] References Cited

U.S. PATENT DOCUMENTS

| | | | |
|---|---|---|---|
| 3,590,274 | 6/1971 | Marley | 307/455 |
| 3,622,799 | 11/1971 | Marley | 307/455 |
| 3,758,791 | 9/1973 | Taniguchi et al. | 307/455 |
| 4,623,802 | 11/1986 | Cline et al. | 307/455 |
| 4,686,395 | 8/1987 | Sato et al. | 307/310 |
| 4,849,659 | 7/1989 | West | 307/455 |

Primary Examiner—Timothy P. Callahan
Attorney, Agent, or Firm—Flehr, Hohbach, Test, Albritton & Herbert

[57] ABSTRACT

Series terminated ECL buffer circuit and method with an opptimized, temperature compensated output voltage swing. The circuit has a pair of node points and an output transistor configured as an emitter follower, with the base of the transistor connected to one of the node points. Resistors having different values of resistance are connected between a voltage source point and respective ones of the node points, and a temperature compensation network comprising a pair of unilaterally conductive legs of opposite polarity and different resistance values is connected between the node points. A current sink is connected selectively to the node points in response to an input signal to cause current to flow selectively through the resistors and the legs of the compensation network to provide an output voltage swing which is relatively independent of temperature and is centered within a predetermined range such as that specified by the standard "ECL100K" specification.

9 Claims, 4 Drawing Sheets

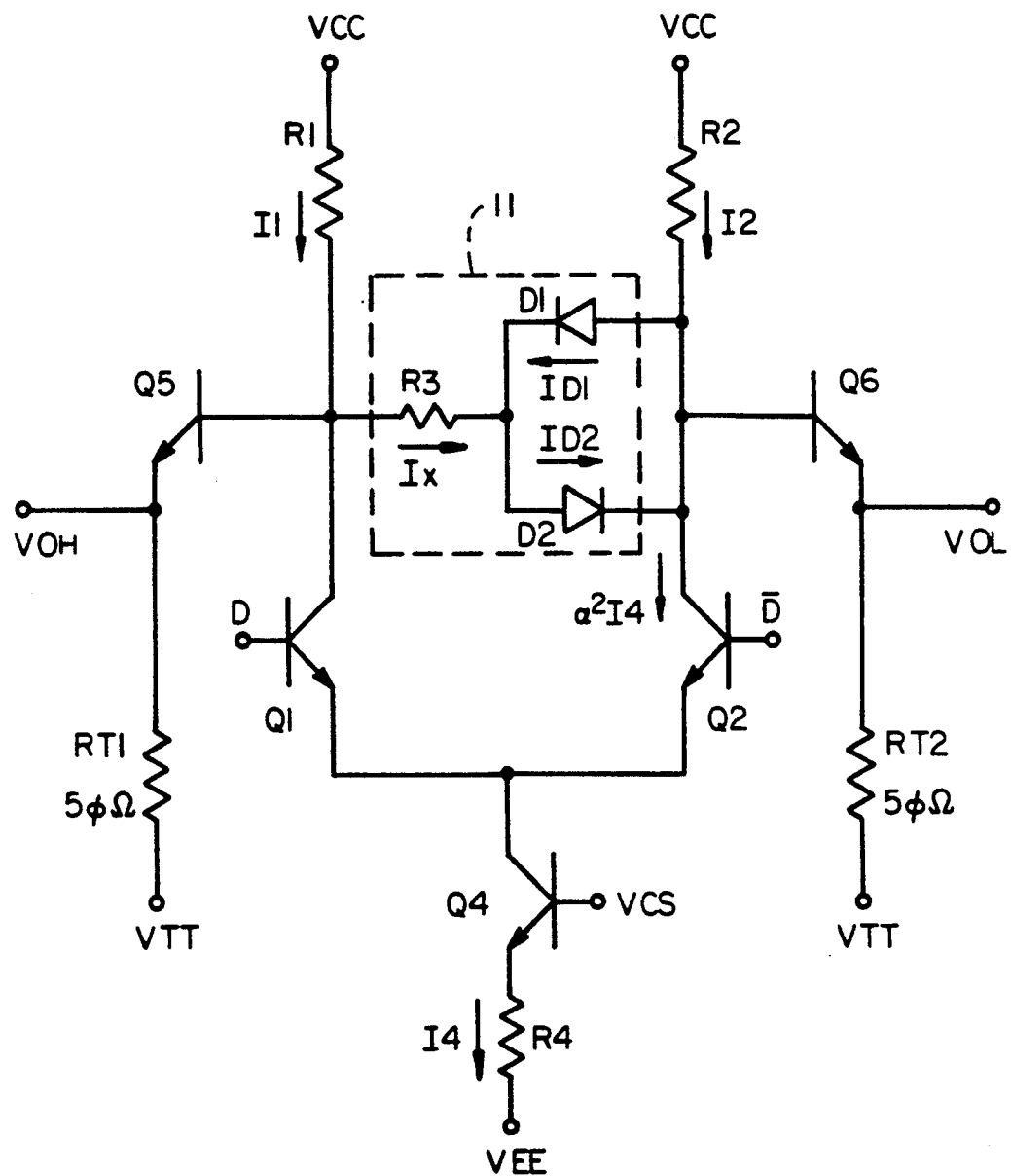
FIG_1
(PRIOR ART)

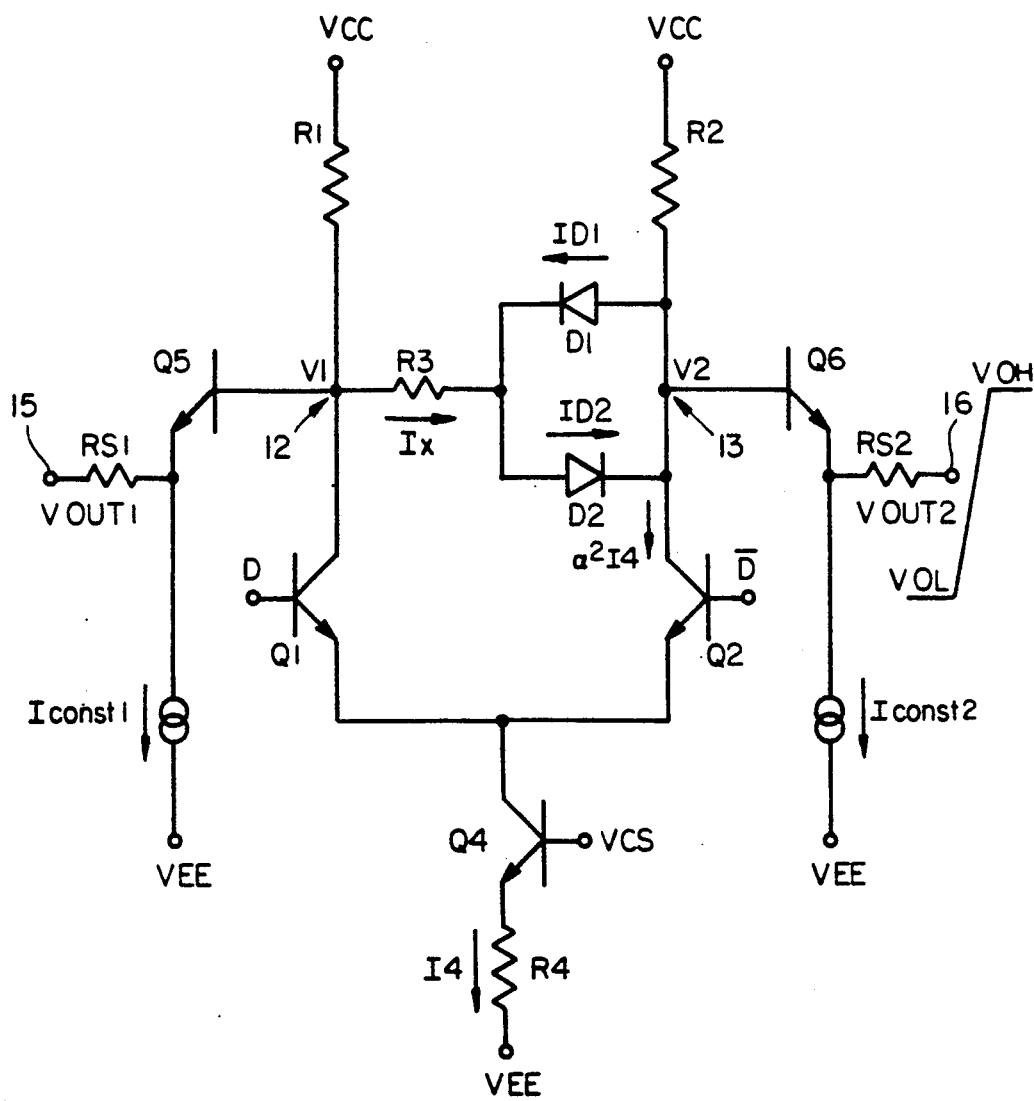
FIG_2
(PRIOR ART)

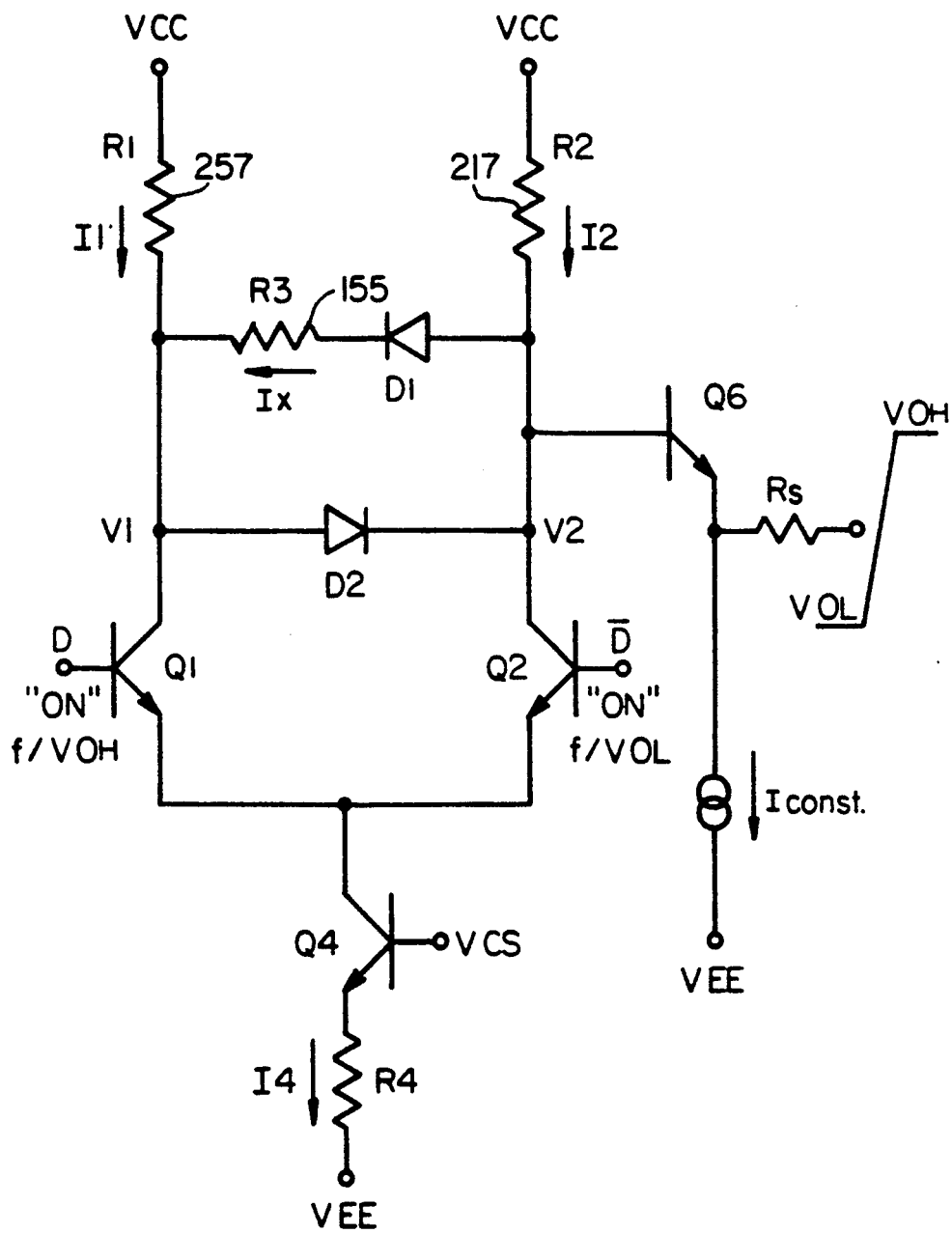
FIG_3

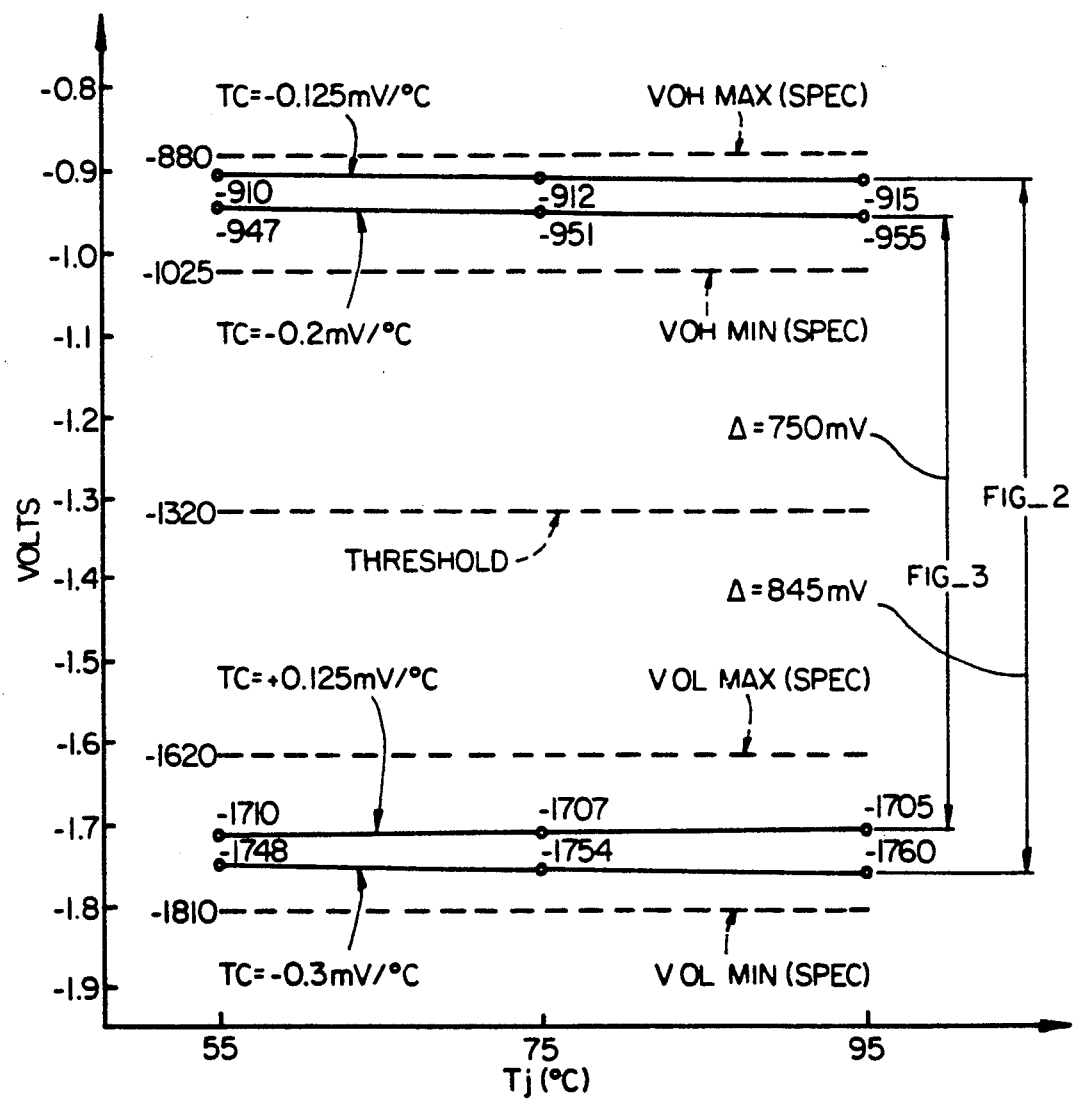
FIG_4

SERIES TERMINATED ECL BUFFER CIRCUIT AND METHOD WITH AN OPTIMIZED TEMPERATURE COMPENSATED OUTPUT VOLTAGE SWING

This invention relates generally to emitter-coupled logic (ECL) circuits and, more particularly, to a series terminated ECL buffer circuit and method having an optimized voltage swing.

ECL buffer circuits are employed in a variety of applications requiring logic circuits, and standards have been established for the design and performance of such devices. One such standard is the so-called "ECL100K" specification which defines the output voltage swing and temperature characteristics of an ECL device.

The circuit illustrated in FIG. 1 is an example of a standard bipolar ECL buffer circuit with parallel output termination. This particular circuit provides logical OR and NOR functions, and the standard OR and NOR output levels are generated for the "ECL100K" specification. The circuit includes a differential pair of switching transistors Q1,Q2, with a transistor Q4 serving as a current sink for the pair. True and complement data input signals D,$\bar{D}$ are applied to the bases of transistors Q1,Q2, respectively. Transistors Q5 and Q6 are true and complement ECL output emitter followers, and resistor R3 and diodes D1,D2 make up an "ECL100K" network 11. Resistors R1-R3 are all of equal resistance (i.e., R1=R2=R3=R), and the voltage VCS applied to the base of current sink Q4 is independent of temperature. The outputs of this buffer are provided with 50 ohm parallel terminating resistors RT1,RT2.

When voltage V1 at node point 12 is at a "high" level and voltage V2 at node point 13 is at a "low" level, the current ID2 flows through diode D2, and the node equation for V2 includes the temperature coefficient of Q4 and a portion of the temperature coefficient of D2. Due to the symmetry in this circuit, the opposite state causes a similar current to flow through diode D1, and a corresponding node equation can be written for V1. The voltages VOH and VOL at "high" output node 15 and "low" output node 16 can be expressed as follows:

$$VOH = VCC - (\tfrac{1}{2})[-VD + R(3Ib) + (\alpha^2 R/R4)(VCS - VBE4)] - VBE6$$

$$VOL = VCC - (\tfrac{1}{2})[R(Ib + Ib/2) + (\alpha^2 R/R4)(VCS - VBE4) + VD/2] - VBE5$$

where VCC is the most positive supply voltage, VD is the voltage drop across diode D1 or D2, VCS is the voltage at the base of current sink transistor Q4, VBE4-VBE6 are the base-emitter voltages of transistors Q4-Q6, and $\alpha$ is the forward transfer current ratio of the transistors.

Neglecting the current Ib since it is small and taking the partial derivative of VOH or VOL with respect to temperature yields:

$$R/R4 = 2/\alpha^2,$$

which results in output levels for both VOH and VOL which are independent of temperature.

Since VCS is constant and the emitter-base voltage Vbe decreases with increasing temperature, Q4 provides a current to the switching pair which increases as a function of temperature. The diode currents ID1,ID2 in the "ECL100K" network are also dependent upon temperature, and the temperature-dependent currents compensate for the temperature dependence of the output emitter followers Q5,Q6. The circuit of FIG. 1 meets the "ECL100K" specification with regard to both output voltage swing and temperature compensation.

It is more difficult, however, to meet the "ECL100K" specification with series termination. FIG. 2 illustrates how the circuit of FIG. 1 can be modified for series termination. In the modified circuit, resistors RS1,RS2 are connected in series with the outputs of transistors Q5,Q6, and loading is provided by constant current sinks $I_{CONST1}$ and $I_{CONST2}$. This makes the base-emitter drops (VBE5,VBE6) in transistors Q5,Q6 constant, the total collector-collector swing between transistors Q1 and Q2 (i.e., V1−V2) now appears at the output. The logic swing (Vls) for the modified circuit is given by the relationship $$Vls = V1 - V2 = (Ix)R3 + VD.$$

This swing is typically greater than the nominal swing specified by the "ECL100K" specification:

$$VOH - VOL = -955 \, mV - (-1705 \, mV) = 750 \, mV.$$

In the parallel terminated circuit of FIG. 1, the output swing is not a problem because VBE5 and VBE6 are not maintained at a constant level, but are free to vary with the output currents. Thus, the higher current in the "high" state causes a lower VOH level, and the lower current in the "low" state causes a higher VOL level.

In other words, starting with a conventional "ECL100K" buffer and loading the output transistors with a constant current sink causes the voltage difference (VBE5−VBE6) to be zero, and the collector swing between transistors Q1 and Q2 (i.e., V1−V2) now determines the logic swing. The net increase in swing including IR drop due to the output emitter resistance is typically on the order of 100 mV, and when VOH and VOL are centered around the threshold level (VBB=−1320 mV), there is about 50 mV less margin in the specified ranges for both VOH(max) and VOL(min).

The invention provides a series terminated ECL buffer and method with an optimized, temperature compensated output voltage swing with levels centered within the standard "ECL100K" specification.

FIG. 1 is a circuit diagram of a prior art ECL buffer with parallel output termination.

FIG. 2 is a circuit diagram of a prior art ECL buffer with series output termination.

FIG. 3 is a circuit diagram of one embodiment of a series terminated ECL buffer according to the invention.

FIG. 4 is a waveform diagram showing the output voltages of series terminated ECL buffers of the prior art and the invention.

In the embodiment of FIG. 3, the circuit of FIG. 2 has been modified to use only one of the two output emitter followers (Q6) and to provide output voltages which are centered in the "ECL100K" high and low ranges. This is possible since most applications use single-ended signals and do not require both true and complement signals for the same output.

In the embodiment of FIG. 3, resistor R1 has a greater resistance than R2, and in the VOH state, this makes the voltage V2 at node point 13 lower than it would be if the two resistors were equal. In the VOH state, transistor Q1 is conducting, and diode D1 is also conducting. In this state, the output voltage VOH is given by the relationship $$VOH = VCC - I2 \cdot R2 - VBE6.$$

Because of current sink Q4, the sum of the current I1 through resistor R1 and the current Ix through diode D1 is constant. Increasing the resistance of R1 produces a decrease in I1, and this causes an increase in Ix and, hence, in the current I2 through resistor R2. This produces an increased voltage drop across R2, which lowers the voltage V2 at node point 13. The values of the resistors R1-R3 are chosen to make the decrease in V2 about 50 mV from what it would be if the resistors were equal. This result has been obtained, for example, with R1=257 Ω, R2=217 Ω, R3=155 Ω, RS=45 Ω, VEE=−4.5 V and VCC=0 V.

In the compensation network of the embodiment of FIG. 3, diode D1 and resistor R3 are connected in series with each other in one leg of the network, and diode D2 is connected in parallel with them in a second leg of the network. This takes R3 out of the current path when D2 is conducting, and the combination of the elimination of R3 and the increase in the resistance of R1 produces an increase of about 50 mV in V2 in the VOL state.

In the VOL state, Q2 and D2 are conducting, and the current through Q2 is constant. The increase in the resistance of R1 (relative to its value in the embodiment of FIG. 2) tends to decrease the current through R1 and D2, but this decrease is offset by the absence of R3 in the circuit with D2. The net effect is an increase in the current through D2 in comparison with the circuit of FIG. 2. This increase causes the current I2 to decrease, thereby decreasing the voltage drop across R2 and raising the level of V2 by about 50 mV.

The output voltages produced by the circuits of FIGS. 2 and 3 are illustrated in FIG. 4. This figure also shows the ranges for VOH and VOL specified by the "ECL100K" standard. These ranges are −880 mV to −1025 mV for VOH and −1620 mV to −1810 mV for VOL. The circuit of FIG. 3 produces a high and low output voltages of about −955 mV and −1705 mV, respectively, and these voltages are well centered in the specified ranges. The swing between these two voltages is about 750 mV. This represents a significant improvement over the circuit of FIG. 2 where the VOH output is about −915 volts, the VOL output is about −1760 volts, and the swing is about 845 mV. From FIG. 4, it can also be noted that the temperature for the output voltages is not significantly different with the modified circuit of FIG. 3 and that the outputs are still well within the "ECL100K" specifications in this regard.

Eliminating the complement output (Q5) and the need for node V1 to drive that output makes it possible to independently set the characteristics of node V2. In this way, VOH and VOL can be optimized to meet a specification such as the "ECL100K" specification using a series terminated ECL buffer circuit.

The invention has a number of important features and advantages. It provides an optimum temperature-independent output voltage swing which centers the levels within the standard "ECL100K" specification. With the smaller swing in the output voltages, the threshold level is crossed sooner, and this provides improved switching speed and performance. No additional parts are required, so there is no increase in layout area. Moreover, by reducing output swing and thereby increasing the noise margins, there is less chance of part rejection due to failure to meet specifications, and functional yield is thereby improved.

It is apparent from the foregoing that a new and improved series terminated ECL buffer and method have been provided. While only certain presently preferred embodiments have been described in detail, as will be apparent to those familiar with the art, certain changes and modifications can be made without departing from the scope of the invention as defined by the following claims.

I claim:

1. In a series terminated ECL circuit: a transistor configured as an emitter follower with a constant base-emitter voltage drop and a serial output termination, first and second node points, means connecting the base of the transistor to the first node point, first and second resistive elements connected between a voltage source point and the first and second node points, respectively, the second resistive element having a higher resistance than the first resistive element, first and second unidirectionally conductive circuits connected between the node points for conducting current toward respective ones of said points, the second circuit having a greater resistance than the first, a constant current sink, and means responsive to an input signal for selectively connecting the node points to the current sink to apply voltage of different levels to the base of the transistor.

2. The circuit of claim 1 wherein the first unidirectionally conductive circuit comprises a diode, and the second unidirectionally conductive circuit comprises a diode and a resistive element connected electrically in series with each other and in parallel with the diode in the first circuit.

3. The circuit of claim 1 wherein the means for connecting the node points to the current sink comprises first and second switching transistors connected between respective ones of the node points and the current sink.

4. In a series terminated ECL circuit: a transistor configured as an emitter follower with a constant base-emitter voltage drop and a serial output termination, a first node point to which the base of the transistor is connected, a second node point, a first resistor connected between a voltage source point and the first node point, a second resistor connected between the voltage source point and the second node point and having a resistance greater than the first resistor, a first diode connected between the node points for conducting current from the second node point to the first node point, a second diode and a resistor connected in series with each other and in parallel with the first diode for conducting current from the first node point to the second, a constant current sink, and means responsive to an input signal for selectively connecting the node points to the current sink.

5. The circuit of claim 1 wherein the means for connecting the node points to the current sink comprise a pair of transistors connected between the node points and the current sink.

6. In a series terminated ECL buffer circuit having an optimized, temperature compensated output voltage swing: a pair of node points, an output transistor configured as an emitter follower, with the base of the transistor connected to one of the node points, a pair of resistors having different values of resistance connected between a voltage source point and respective one of the node points, a temperature compensation network comprising a pair of unilaterally conductive legs of opposite polarity and different resistances connected between the node points, a current sink, and means responsive to an input signal for selectively connecting the node points to the current sink to cause current to flow selectively through the resistors and the legs of the compensation network to provide an output voltage swing which is relatively independent of temperature and is centered within a range determined by the resistances of the resistors and the legs of the compensation network.

7. The circuit of claim 6 wherein the resistor connected to the node point to which the base of the output transistor is connected has a smaller value of resistance than the resistor connected to the other node point.

8. The circuit of claim 6 wherein one leg of the compensation network comprises a diode and a resistor connected in series, and second leg of the network comprises a diode connected in parallel with the first leg and polarized oppositely to the diode in the first leg.

9. In a method of maintaining the output voltage swing of a series terminated ECL buffer circuit within predetermined specifications, said circuit having a pair of nodes and an emitter follower output transistor connected to one of the nodes, the steps of: supplying current to respective ones of the nodes from a comon voltage source through a pair of resistors having unequal values of resistance, conducting current between the nodes in opposite directions through a temperature compensation network having a pair of unilaterally conductive legs of unequal resistance, and selectively connecting the nodes to a current sink in response to an input signal to control the flow of current through the resistors and the temperature compensation network to provide a voltage swing at the node to which the output transistor is connected which is relatively independent of temperature and is centered within a range determined by the resistances of the resistors and the legs of the temperature compensation network.

* * * * *